United States Patent
Wang et al.

(10) Patent No.: US 10,752,998 B2
(45) Date of Patent: Aug. 25, 2020

(54) AGING RESISTANCE COATING FILM FOR HUB AND METHOD FOR FORMING PROTECTIVE FILM

(71) Applicant: CITIC Dicastal CO., LTD., Qinhuangdao, Hebei (CN)

(72) Inventors: Zaide Wang, Qinhuangdao (CN); Huanming Ma, Qinhuangdao (CN); Junfu Li, Qinhuangdao (CN); Shengchao Zhang, Qinhuangdao (CN); Guangcai Chen, Qinhuangdao (CN); Meng Liu, Qinhuangdao (CN)

(73) Assignee: CITIC Dicastal Co., Ltd., Qinhuangdao (CN)

( * ) Notice: Subject to any disclaimer, the term of this patent is extended or adjusted under 35 U.S.C. 154(b) by 0 days.

(21) Appl. No.: 16/026,101

(22) Filed: Jul. 3, 2018

(65) Prior Publication Data
US 2019/0284702 A1   Sep. 19, 2019

(30) Foreign Application Priority Data
Mar. 15, 2018  (CN) .......................... 2018 1 0213141

(51) Int. Cl.
| | | |
|---|---|---|
| *C23C 14/02* | (2006.01) | |
| *C23C 14/35* | (2006.01) | |
| *C23C 28/00* | (2006.01) | |
| *C23C 14/20* | (2006.01) | |
| *C23C 14/58* | (2006.01) | |
| *C23C 14/06* | (2006.01) | |
| *B05D 7/00* | (2006.01) | |
| *B05D 3/10* | (2006.01) | |
| *C23C 14/00* | (2006.01) | |

(52) U.S. Cl.
CPC .............. *C23C 28/34* (2013.01); *B05D 3/102* (2013.01); *B05D 7/57* (2013.01); *C23C 14/0015* (2013.01); *C23C 14/02* (2013.01); *C23C 14/024* (2013.01); *C23C 14/0635* (2013.01); *C23C 14/0688* (2013.01); *C23C 14/20* (2013.01); *C23C 14/352* (2013.01); *C23C 14/58* (2013.01); *B05D 2202/25* (2013.01); *B05D 2451/00* (2013.01)

(58) Field of Classification Search
CPC ......... C23C 28/34; C23C 14/02; C23C 14/20; C23C 14/352; C23C 14/58
USPC .......................................... 427/458
See application file for complete search history.

(56) References Cited

U.S. PATENT DOCUMENTS

| | | | | |
|---|---|---|---|---|
| 4,524,106 A | * | 6/1985 | Flasck | ...................... B05D 5/06 |
| | | | | 204/192.15 |
| 6,767,435 B1 | * | 7/2004 | Kitagawa | ............... B05D 5/068 |
| | | | | 204/192.15 |
| 2005/0067273 A1 | | 3/2005 | Goodrich | |

FOREIGN PATENT DOCUMENTS

CN    101343740 A    1/2009

OTHER PUBLICATIONS

Supplementary European Search Report in the European application No. 19161940.2, dated Jul. 17, 2019, 16 pgs.

* cited by examiner

*Primary Examiner* — Alexander M Weddle
(74) *Attorney, Agent, or Firm* — IPro, PLLC; Qian Gu

(57) ABSTRACT

Disclosed herein is an aging resistance coating film for a hub, sequentially comprising an aluminum alloy matrix, a silane conversion film, a high-gloss organic resin coating, a periodic variable alloy black chromium coating film and a transparent resin coating. In the coating film, the thickness of the black chromium coating film is increased and the blackness thereof is adjusted according to different content of C. The residual stress of the deposited metal layer is reduced, the problem of cracking during heating and rapid cooling of the coating film is solved, and the binding force between the coating film and the underlying high-gloss resin material is improved. Also disclosed herein is a method for forming an aging resistance coating film for a hub, comprising: (1) silane pretreatment, (2) spraying of high-gloss medium powder, (3) PVD coating, and (4) spraying of transparent powder.

2 Claims, No Drawings

AGING RESISTANCE COATING FILM FOR HUB AND METHOD FOR FORMING PROTECTIVE FILM

CROSS-REFERENCE TO RELATED APPLICATIONS

This application is filed based upon and claims priority to Chinese Patent Application No. 201810213141.X, filed on Mar. 15, 2018, the contents of which are hereby incorporated by reference in its entirety.

BACKGROUND

Vapor deposition surface treatment methods include evaporation, plasma multi-arc sputtering, magnetron sputtering and reactive sputtering. Magnetron sputtering is widely used in the manufacturing industry of automotive parts. Automotive hubs using magnetron sputtering as surface decoration have been applied and promoted in the after-market. The characteristic of magnetron sputtering is to make the surface of a part achieve the metallic mirror gloss decoration effect. By combining with conventional coating, not only is the part attractive, but also the coating performance can meet the automotive factory standards.

Magnetron sputtering is a method that the working gas is ionized in a vacuum chamber, the ionized ions bombard a metal target at a high speed under the mixed field action of an electric field and a magnetic field and the metal atoms or ions on the target sputter out and are deposited on the surface of a workpiece. This method can achieve a new effect of metallic appearance of a glossy mirror, and is environment-friendly and low in cost. The target may be a non-magnetic metal, a non-metal or an alloy. According to the corrosion resistance standard of a main engine plant coating, an appropriate metal or alloy is selected to meet the requirements for surface corrosion resistance, weather resistance, decorativeness and the like. The surface of the aluminum alloy cast hub is relatively rough and cannot be directly coated to form a smooth and bright coating film, so an organic coating must be sprayed onto the hub, and then a metal film is sputtered on the bright organic coating. In order to prolong the long-term gloss of the metal coating film, a transparent powder coating is sprayed onto the coating film, so that the coating film material achieves good binding force with the upper and lower organic coatings. The coating film itself must also have high corrosion resistance.

There are three types of magnetron sputtering methods: I, a black transparent paint is sprayed onto the bright white metal coating film to achieve a bright black chromium appearance; II, black high-gloss resin is sprayed onto the metal coating film to reduce the thickness of the coating film, so that the coating film is translucent, transmits the underlying black and is black and bright; the above two methods have respective advantages and disadvantages: in the first method, the color transparent paint easily produces color aberration, the black transparent paint is different in thickness and color, and the black transparent coating generally has a thickness of 10-30 microns, is poor in protection on the coating film and cannot achieve long-term use standards; and in the second method, the translucent coating film cannot completely cover the underlying resin, and long-term exposure and ultraviolet aging lead to interlayer adhesion failure.

SUMMARY

The disclosure relates to the field of surface treatment, in particular to an aging resistance coating film for a hub and a method for forming the protective film.

Disclosed herein is an alloy black chromium coating film that can produce a black and bright metal color, achieve certain thickness to cover underlying resin and has excellent aging resistance, and a method of forming the protective film.

An aging resistance coating film for a hub, sequentially including: an aluminum alloy matrix, a silane conversion film, a high-gloss organic resin coating, a periodic variable alloy black chromium coating film and a transparent resin coating.

The silane conversion film is obtained by adopting a silane pretreatment and passivation process, and mainly improves the binding force between the aluminum alloy and the organic coating and the corrosion resistance of the aluminum alloy surface. The high-gloss organic resin coating is an epoxy resin coating. An epoxy powder coating material is electrostatically sprayed on the surface of the aluminum alloy hub and cured by an oven to form a coating with extremely high finish. The periodic variable alloy black chromium coating film is a C—Cr periodic variable alloy black chromium coating film obtained from a high-purity C target and a high-purity Cr target by setting different coating processes. 90%-0 of C component changes periodically, 10-100% of Cr metal component changes periodically, the two materials change periodically in accordance with the above alloy composition to achieve a black metal color, and the power of the C target is adjusted to form different coating film components and obtain a black chromium alloy coating film with different blackness;

the transparent resin film is a pure acrylic resin coating, and the high transparent coating is formed on the film by electrostatic powder spraying.

The periodic variable alloy black chromium coating film consists of two materials: C and Cr, in which the percentage of each material is different and the color of the coating film is also different.

The high-gloss organic resin coating has a thickness of 120-250 µm, and fully covers the aluminum alloy casting surface and the machining knife grains, so that the surface of the aluminum alloy hub achieves a shining and smooth mirror effect.

According to the C—Cr aging resistance periodic variable alloy black chromium coating film for the hub, Cr is primed first with a thickness of 5-10 nm to improve the binding force between the coating film and the organic coating, then the double targets are opened, C and Cr change periodically in accordance with the ratio of 10:90 to 90:10 for coating with a thickness of 80-150 nm, finally only the pure Cr target is opened to form a thickness of 5-10 nm, and the thickness of the entire film is 100-170 nm.

The thickness of the transparent resin coating is 80-150 µm, and an electrostatic powder coating spraying method is adopted to fully protect the coating film and form good binding force with the coating film.

Also disclosed herein is a method for forming an aging resistance coating film for a hub, including: (1) silane pretreatment, (2) spraying of high-gloss medium powder, (3) PVD coating, and (4) spraying of transparent powder.

The silane pretreatment includes the steps of hot water washing, de-greasing and alkaline washing, hot water washing, water washing, acid washing, pure water washing, pure water washing, silane passivation, pure water washing, closing, pure water washing and moisture drying.

The spraying of a high-gloss powder coating means that an epoxy powder coating material is electrostatically sprayed onto the metal surface of the hub and cured, in which the base powder is epoxy resin powder or a polyester powder coating material. After the coating is cured, the surface achieves mirror finish and has good adhesion to the aluminum matrix.

The PVD coating refers to high vacuum magnetron sputtering on the surface of the hub after the medium powder is cured, the sputtering target includes a pure C target and a pure Cr metal target, the two targets are set with different power according to the colors and opened for coating in accordance with the process one after another, the hub in the equipment can rotate and revolve, the two targets are sputtered onto the surface of the hub in certain sequence and proportion of C and Cr, the surface coating film is uniform in thickness and color by means of rotation and revolution of the hub, and the coating film has good binding force with the underlying high-gloss resin coating.

The spraying of transparent powder means that the transparent powder is sprayed onto the surface of the hub after the PVD coating and cured, the transparent powder is an acrylic resin or polyester powder coating material, the transparent coating has good binding force with the coating film, and the resin itself also has aging resistance and other properties.

In one embodiment of the disclosure, step (1) of pretreating the surface includes water washing, alkaline washing, water washing, acid washing, pure water washing, passivation, pure water washing, closing, pure water washing, pure water washing and drying, in which a silane conversion film is obtained by the passivation, with excellent metal corrosion resistance, environment friendliness and no heavy metal pollution.

In one embodiment of the disclosure, in step (2), the high-gloss medium powder is with a thickness of 80 to 150 μm, the spoke surface curing temperature is 220° C., the curing time is 20 min, epoxy resin is preferred, and the hardness of the resin is preferably 2-3 H. The base powder may be black or gray, and has good binding force with the aluminum alloy surface and strong corrosion resistance. The surface achieves mirror finish, with a T-G point of 80-120° C.

In step (3), the temperature of the coated workpiece is 80-150° C., the flow rate of argon as working gas is 40-80 cc/min, the coating current for the C target and the chromium target is 15-30 A, and the voltage is more than or equal to 550 v and less than or equal to 800 v; the vacuum degree is $(2-8) \times 10^{-3}$ Pa, the double target coating time is 15-40 s, the working gas is 99.999% argon, and the coating ambient humidity is less than or equal to 50%. According to the coating sequence, pure chromium is opened first for 3-7 seconds, then the double targets are opened 14-24 seconds at the same time, finally, pure chromium is opened 3-7 seconds for separate coating, the C and Cr content changes periodically, and a periodic variable alloy black chromium coating film is generated.

In one embodiment of the disclosure, in step (4), the pure acrylic transparent powder is sprayed with a thickness of 80-150 μm, the surface curing temperature of the hub is 175° C., the curing time is 20 min, the thicknesses of the surfaces A, B and C of the hub are not less than 80 μm, and the coating performance is effectively improved. Acrylic transparent paint may also be sprayed after the polyester transparent powder is sprayed and cured.

The disclosure has the advantages: the thickness of the black chromium coating film is increased and the blackness thereof is adjusted according to different content of C. The residual stress of the deposited metal layer is reduced, and the problem of cracking during heating and rapid cooling of the coating film is solved; the binding force between the coating film and the underlying high-gloss resin material is improved; the binding force between the coating film and the surface transparent coating and the durability of the binding force are improved; the black-chromium and bright appearance is formed, and the effects of beautifying and decoration are achieved; the coating system has good corrosion resistance; and the coating film is thick and strong in coverage, effectively prevents ultraviolet transmission, and improves the durability and the aging resistance. The technical solution of the disclosure can also be applied to other applications such as notebook cases, car interior trims, bathroom pipe fittings and the like.

DETAILED DESCRIPTION

Unless otherwise specified, the embodiments of the disclosure adopt two targets, one is C target, the mass percentage of C is 99.95%, the other one is pure Cr, and the purity of Cr metal is 99.99%. The PVD equipment is a high vacuum magnetron sputtering coating machine. Sputtering base materials: aluminum alloy with a surface A356.2; high-gloss medium powder coating material: pure epoxy resin coating material; transparent coating: pure acrylic transparent powder coating material. Coating inspection standards: inspect in accordance with the US general motor hub coating performance standards, with items including Baige adhesion, CASS, FLIFORM, high humidity resistance test, gravel impact, thermal shock resistance test, aging resistance, etc.

A method for forming an aging resistance coating film for a hub includes: (1) silane pretreatment, (2) spraying of high-gloss medium powder, (3) PVD coating, and (4) spraying of transparent powder.

The silane pretreatment includes the steps of hot water washing, de-greasing and alkaline washing, hot water washing, water washing, acid washing, pure water washing, pure water washing, silane passivation, pure water washing, closing, pure water washing and moisture drying;

The spraying of a high-gloss powder coating means that an epoxy powder coating material is electrostatically sprayed onto the metal surface of the hub and cured, in which the base powder is epoxy resin powder or a polyester powder coating material. After the coating is cured, the surface achieves mirror finish and has good adhesion to the aluminum matrix.

High vacuum magnetron sputtering is performed on the surface of the hub after the medium powder is cured, the sputtering target includes a pure C target and a pure Cr metal target, the two targets are set with different power according to the colors and opened for coating in accordance with the process one after another, the hub in the equipment can rotate and revolve, the two targets are sputtered onto the surface of the hub in certain sequence and proportion of C and Cr, the surface coating film is uniform in thickness and color by means of rotation and revolution of the hub, and the coating film has good binding force with the underlying high-gloss resin coating; the temperature of the coated workpiece is 100° C., the flow rate of the working gas is 80 cc/min, the coating current is 15 A for the C target and 30 A for the pure chromium target, and the voltage is 675 v; the vacuum degree is $5 \times 10^{-3}$ Pa; in the first phase, pure Cr is opened, the coating time is 6 s, and the revolution speed is 3 seconds per revolution; in the second phase, pure Cr and pure C targets are opened, the coating time is 30 s, and the revolution speed is 3 seconds per revolution; in the third phase, pure Cr is opened, the coating time is 6 s, and the revolution speed is 3 seconds per revolution; the working gas is 99.999% argon, and the coating ambient humidity is 38%.

The spraying of transparent powder in the process means that the transparent powder is sprayed onto the surface of the hub after the PVD coating and cured, the transparent powder is an acrylic resin or polyester powder coating material, the transparent coating has good binding force with the coating film, and the resin itself also has aging resistance and other properties.

Comparative Example 1: A PVD protective layer is prepared using a common method in the art. The target is a single pure Cr target, the base powder is black, and the PVD semi-permeable film achieves a black chromium coating film. The adopted process method and coating structure are the same as those of the preparation method of the disclosure.

Comparative Example 2: A PVD protective layer is prepared using a common method in the art. The target is a single NiCr alloy target, the base powder is black, and the PVD semi-permeable film achieves a black chromium coating film. The adopted process method and coating structure are the same as those of the preparation method of the disclosure.

The following tests and comparisons are carried out using the multi-layer sputtered coatings with metal surface ductility in embodiment 1 and comparative examples 1 and 2, as shown in the following table:

| Group | Embodiment 1 | Comparative example 1 | Comparative example 2 |
|---|---|---|---|
| Coating color | L = 65.0, a = 0.1, b = −2.2 | L = 64.5, a = 0.1, b = −2.2 | L = 65.2, a = 0.1, b = −2.2 |
| Surface cracking | No cracks | Cracked | No cracks |
| Coating thickness | 120 nm | 56 nm | 58 nm |
| Baige adhesion | 100% shedding-free | 100% shedding-free | 100% shedding-free |
| CASS | 1.0 mm | 1.1 mm | 4.2 mm |
| FLIFORM | 2.3 mm | 3.1 mm | 5.8 mm |
| Water resistance test | No change, adhesion 100% shedding-free | No change, adhesion 91% shedding-free | No change, adhesion 77% shedding-free |
| Thermal impact | Shedding-free | 10% shedding | 13% shedding |
| Aging resistance | No change, adhesion 100% coating film shedding-free | No change, adhesion 65% coating film shedding-free | No change, adhesion 61% coating film shedding-free |

It can be seen that in the method of the disclosure, the coating temperature, the argon flow rate, the coating current, the vacuum degree, the NiCr alloy target and the pure Cr coating time are the key parameters, and the proportion of C and Cr and the coating parameters are the key of obtaining the thickness of the coating film and the aging resistance. By optimizing the above process, a PVD coating film with good properties is obtained. In the disclosure, the technical solution of the embodiment obtains the optimum condition by exploring the above conditions. Coating test results are best under this optimal condition.

The invention claimed is:

1. A method for forming a coating film resistant to change of properties over time for an aluminum alloy wheel hub, comprising:
pretreating the aluminum alloy wheel hub, comprising forming a silane conversion film on a surface of the aluminum alloy wheel hub;
forming a high-gloss medium powder coating on the silane conversion film by electrostatically spraying an epoxy powder coating material and curing the epoxy powder coating material, wherein a base powder of the high-gloss medium powder coating is epoxy resin powder or a polyester powder coating material;
forming a physical vapor deposition (PVD) coating on the high-gloss medium powder coating by a high vacuum magnetron sputtering equipment which is provided with a pure C sputtering target and a pure Cr metal sputtering target, wherein a power of the pure C sputtering target and a power of the pure Cr metal sputtering target are set so as to adjust content of C and thus adjust degree of blackness of the PVD coating, wherein the pure C sputtering target and the pure Cr metal sputtering target are activated in a predetermined sequence, wherein rotation and revolution of the aluminum alloy wheel hub in the high vacuum magnetron sputtering equipment allow the PVD coating to be formed uniformly in thickness and color, and wherein the PVD coating has binding force with the high-gloss medium powder coating; and
spraying transparent powder on the PVD coating and curing the transparent powder, wherein the transparent powder is an acrylic resin or a polyester powder coating material, and wherein the transparent coating has binding force with the PVD coating.

2. The method for forming a coating film resistant to change of properties over time for an aluminum alloy wheel hub according to claim 1,
wherein the epoxy powder coating material is cured for 20 min at a temperature of 220° C.,
wherein a hardness of the high-gloss medium powder coating is 2-3 H,
wherein a color of the base powder is black or gray,
wherein a glass transition temperature of the base powder is 80-120° C.,
wherein a thickness of the high-gloss medium powder coating is 80-150 μm,
wherein a temperature of the aluminum alloy wheel hub is set as 80-150° C. for forming the PVD coating,
wherein a flow rate of argon with a purity of 99.999% as a working gas in the high vacuum magnetron sputtering equipment is set as 40-80 cc/min,
wherein electric currents of the pure C sputtering target and the pure Cr metal sputtering target for forming the PVD coating are set as 15-30 A,
wherein voltages of the pure C sputtering target and the pure Cr metal sputtering target for forming the PVD coating are set as 550-800 V,
wherein a vacuum degree in the high vacuum magnetron sputtering equipment for forming the PVD coating is set as $2 \times 10^{-3}$-$8 \times 10^{-3}$ Pa,
wherein an ambient humidity for forming the PVD coating is set as less than or equal to 50%,
wherein the predetermined sequence of activating the pure C sputtering target and the pure Cr metal sputtering target is as follows:
first activating the pure Cr metal sputtering target for 3-7 seconds;
secondly activating the pure C sputtering target and the pure Cr metal sputtering target simultaneously for 14-24 seconds; and finally activating the pure Cr metal sputtering target for 3-7 seconds, wherein C content changes from 90% to 0%, and Cr content changes from 10% to 100% in the PVD coating, thereby obtaining an alloy black chromium coating film with C content and Cr content changing periodically, wherein the transparent powder is cured for 20 min at a temperature of 175° C., and wherein a thickness of a layer formed by spraying the transparent powder is 80-150 μm.

* * * * *